United States Patent [19]

Carter et al.

[11] 4,193,047
[45] Mar. 11, 1980

[54] FREQUENCY SELECTIVE FERRIMAGNETIC POWER LIMITER

[75] Inventors: Philip S. Carter, Palo Alto, Calif.; Steven N. Stitzer, Ellicott City; Harry Goldie, Randallstown, both of Md.

[73] Assignee: The United States of America as represented by the Secretary of the Air Force, Washington, D.C.

[21] Appl. No.: 902,130

[22] Filed: May 2, 1978

[51] Int. Cl.² .............................................. H01P 1/22
[52] U.S. Cl. ................................. 333/17 L; 333/24.2; 333/222
[58] Field of Search ................... 333/17 L, 24.2, 73 S, 333/204, 205

[56] References Cited

U.S. PATENT DOCUMENTS

| 3,113,278 | 12/1963 | Okwit | 333/24.2 |
| 4,146,896 | 3/1979 | Baril et al. | 333/204 X |

Primary Examiner—Paul L. Gensler
Attorney, Agent, or Firm—Joseph E. Rusz; Robert Kern Duncan

[57] ABSTRACT

Two sectoral radial resonators coupled at their centers of radii by a strip transmission line and doubly loaded with opposing ferrimagnetic spheres between the said strip transmission line and the ground planes provides a frequency selective power limiter.

1 Claim, 10 Drawing Figures

FREQUENCY SELECTIVE FERRIMAGNETIC POWER LIMITER

RIGHTS OF THE GOVERNMENT

The invention described herein may be manufactured and used by or for the Government of the United States for all governmental purposes without the payment of any royalty.

BACKGROUND OF THE INVENTION

The field of the invention is in the high frequency filter art and more particularly in that of ferrimagnetic power limiters in microwave systems.

The basic principles of frequency selective powers limiters employing ferrimagnetic materials are well known. In the limiters described here, the phenomenon causes adsorption and reflection of the incident power when the level of this power is greater than a certain threshold value. If a much weaker signal is simultaneously present along with the higher power, above threshold, signal, the weak signal will not be absorbed or otherwise distorted provided that its frequency is sufficiently displaced from that of the strong signal, e.g., typically by at least a few MHz.

In limiters which are used to protect the sensitive elements in the front ends of receivers, a very low threshold power is usually desired, of the order of a milliwatt. To achieve this low threshold, various methods are used to intensify the RF magnetic field in the vicinity of the ferrimagnetic material, including the use of dielectric materials and dielectric resonators. In a typical prior art device which made use of a waveguide cavity, early investigators were able to achieve a 14 dBm power threshold in a device having a 20 MHz bandwidth. If this approach were used to achieve a 1 milliwatt (0 dBm) limiting threshold by narrowing the bandwidth, the resulting bandwidth would be so small, i.e., about 1.5 MHz, that the limiter would have few practical applications. Also, narrowing the bandwidth of the limiter to 1.5 MHz would result in increasing the insertion loss to 12 dB, making it useless as a receiver front-end protector.

The dielectric resonator approach previously mentioned requires certain minimum resonator dimensions; the size cannot be indefinitely reduced to achieve lower and lower threshold power levels. In addition, only a limited number of materials, namely the titanates, such as strontium titanate with a relative dielectric constant $\epsilon_r = 300$, and titanium dioxide, for which $\epsilon_r = 98$ are presently available. Dielectric resonator limiters which make use of these materials have several drawbacks, namely (1) variation of the dielectric constant and therefore of the resonant frequency with temperature, and (2) a tendency to crack under the mechanical stresses induced by high temperature gradients. Adverse environments may also produce similar conditions and tendencies. Finally, fabrication of dielectric resonators is a fairly expensive process.

There was a need prior to this invention, therefore, for a RF limiter structure which yielded very low threshold power while maintaining useful operating bandwidth and adequately low signal insertion loss. The present invention fulfills these requirements.

The best known prior art may be found in the following patents: U.S. Pat. No. 4,044,357 to patentee Goldie; U.S. Pat. No. 3,906,404 to patentee Dixon; U.S. Pat. No. 3,500,256 to patentees Carter et al, U.S. Pat. No. 3,289,112 to patentee Brown; U.S. Pat. No. 3,082,383 to patentee Stern; and U.S. Pat. No. 2,553,649 to patentee Garfitt.

SUMMARY OF THE INVENTION

The invention provides a novel frequency selective power limiter having a low threshold power, a large dynamic range, good temperature stability and mechanical integrity, that is simple in design and construction, and readily adaptable to tandem operation.

BRIEF DESCRIPTION OF THE DRAWING

FIG. 3b schematically represents a section view of the sectoral radial resonator shown in FIG. 3a;

DESCRIPTION OF THE PREFERRED EMBODIMENTS

Figure 1A:
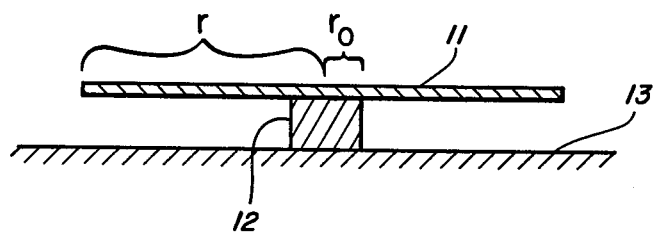
FIG. 1a schematically represents a resonant section of radial transmission line having a short circuit to ground at its inner radius.
Figure 1B:
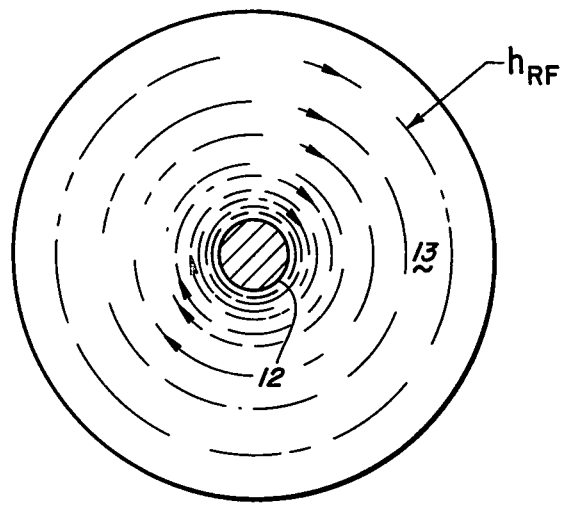
FIG. 1b schematically illustrates the concentration of the radio frequency magnetic field.
Figure 1C:
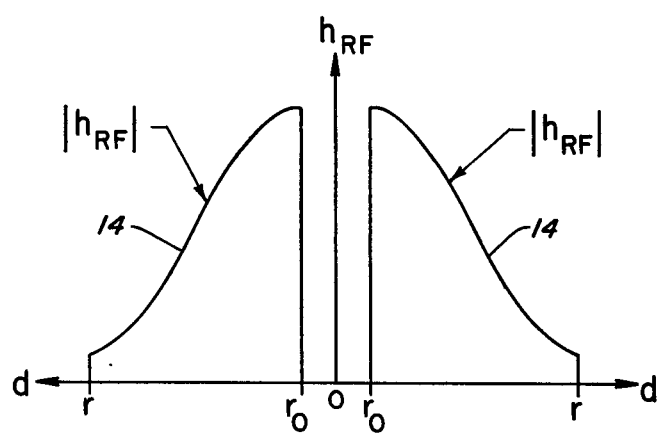
FIG. 1c is a representative plot of the radio frequency magnetic field across a diameter of the resonator.

The invention uses sections of resonant radial transmission line, with the ferrimagnetic power limiting element placed in a region of the resonator in which the RF magnetic field is most highly concentrated. FIG. 1a illustrates a resonant section 11 of radial line, having major radius r and minor radius $r_o$, short circuited by post 12 to the shield or ground plane 13 at the inner radius, $r_o$. Ferrimagnetic material, typically spherical elements, are placed in the region between the resonator and the nearest ground plane. In the region near the short-circuiting post, the magnetic field is most intense, and a large fraction of the RF magnetic energy is concentrated there. This is illustrated in FIGS. 1b and 1c. FIG. 1b is a diagram showing the circular configuration 13 of the RF magnetic field, $h_{rf}$, in the fundamental or lowest frequency mode of resonance. FIG. 1c is a graph of the intensity of this field as a function of radial distance from the center. The rapid decrease in intensity 14 of the field with departure from the post is shown.

Figure 2:
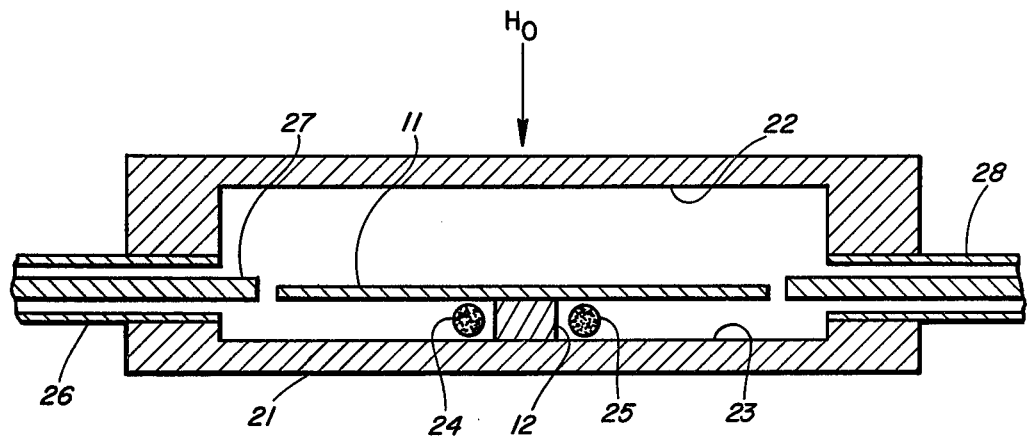
FIG. 2 schematically illustrates a modification of the radial resonator of FIG. 1 to provide a limiter.

The placement of the radial resonator inside a nonmagnetic conducting enclosure 21, as illustrated in FIG. 2, is necessary for shielding purposes. In FIG. 2, the upper conducting surface or ground plane 22 is shown spaced considerably further from the resonator 11 than the lower ground plane 23. With this configuration most of the electromagnetic field is concentrated in the region between the lower ground plane and the resonator, where the ferrimagnetic material 24 and 25 is located. YIG (yttrium-iron-garnet) spheres are typical and suitable ferrimagnetic materials.

It is preferable that the ferrimagnetic material be placed in the region near the center post 12 at positions around the post circumference. A conventional dc magnetic bias field $H_o$ is applied perpendicular to the radial resonator containing the RF field by means of an external magnet, the magnitude of $H_o$ being chosen to optimize (usually to minimize) the threshold power. Values between 1200 and 1400 gauss are generally suitable. The conventional input transmission line 26 is capacitive coupled to the radial resonator 11 by the conventional capacitive coupling probe 27. Likewise, the output line 28 is also capacitively coupled to the resonator 11.

Figure 3A:
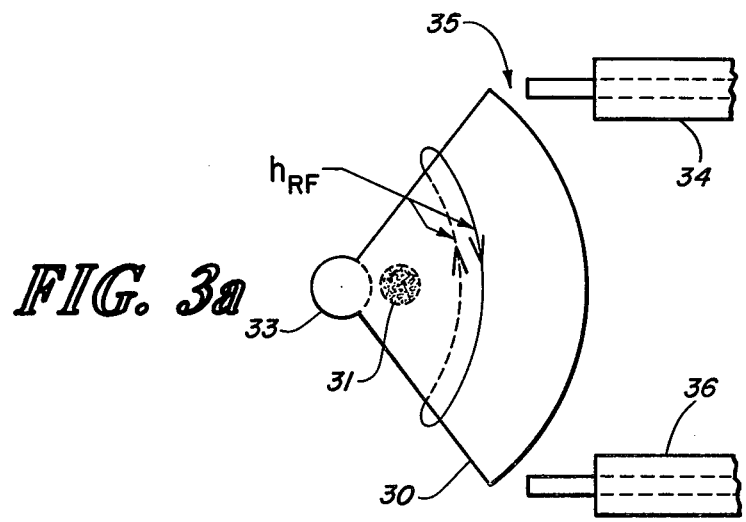
FIG. 3a schematically represents a ferrimagnetic limiter fabricated with a sectoral radial resonator.
Figure 3B:
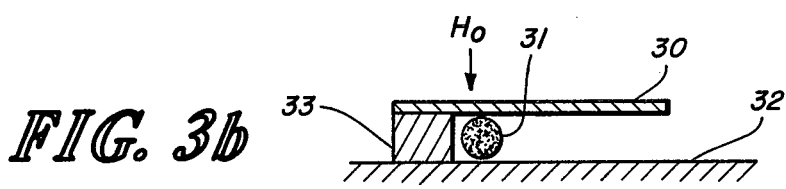

It has been found that even greater intensification of the RF magnetic field can be achieved by use of a sectoral radial resonator as shown in FIGS. 3a and 3b. The RF magnetic field $h_{RF}$ is further concentrated using this type of radial resonator since its volume is smaller, approximately $\theta/360$ times the volume of the corresponding circular radial resonator, where $\theta$ is the sectoral angle of the sector resonator 30. The ferrimagnetic material 31, typically a YIG sphere, is positioned between the resonant sector 30 and the ground plane 32 adjacent the inner radius and shorting post 33. The input transmission line 34 is capacitively coupled 35 between the probe and the sector. Likewise, the output transmission line 36 is also capacitance coupled to the resonant sector. Sectors having the included angle $\theta$ from approximately 90 degrees to approximately 100 degrees have been found to be generally preferred for embodiments of the invention. The angle is not critical with the smaller angles producing relatively greater flux concentrations.

Figure 4A:
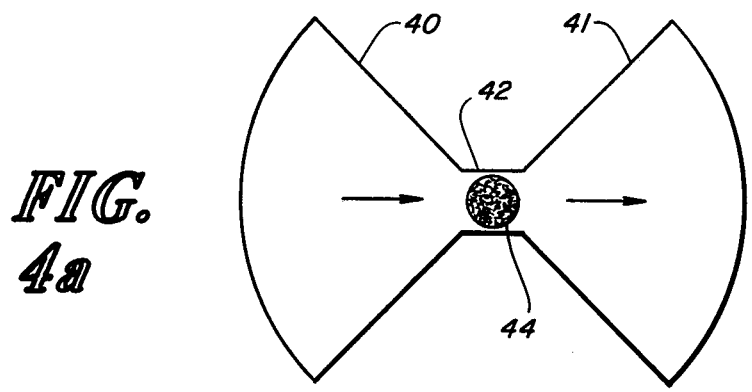
FIG. 4a schematically represents, in plan view, the resonators in an embodiment of the invention having two strip-line-interconnected radial resonators.
Figure 4B:
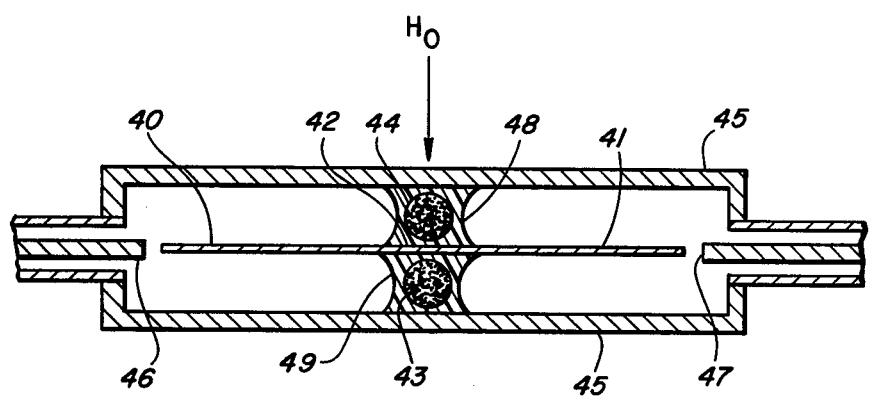
FIG. 4b schematically illustrates in section an embodiment of the invention having two strip-line-interconnected radial resonators with opposing ferrimagnetic spheres.

FIGS. 4a and 4b show a limiter configuration employing two sectoral radial resonators 40 and 41 connected by means of a short length of uniform or strip transmission line 42. In this, the generally preferred embodiment, the ferrimagnetic material 43 and 44 is placed between the strip transmission line 42 and the shield 45 substantially adjacent the inner radii of the resonators. Ferrimagnetic material is placed on both sides of the strip transmission line to achieve a larger filling factor and therefore a larger dynamic range. An important advantage of this configuration is that, unlike the short circuited resonators in FIGS. 1 to 3, there are no direct connections from the resonator to the ground plane or shield. This makes it possible to achieve a higher unloaded Q and therefore a lower below-threshold insertion loss. As in the previously described embodiments the resonant radial sectors 40 and 41 are capacitively coupled to the input and output transmission lines by probes 46 and 47 respectively. The ferrimagnetic spheres 43 and 44 are conventionally cemented 48 and 49 (epoxy is suitable) to the upper and lower inside surfaces of the case shield 45 and to the strip transmission line 42 holding the assembly rigidly in place with the sectoral radial resonators substantially centered between the upper ground plane formed by the upper inside surface and the lower ground plane formed by the lower inside surface.

Figure 5:
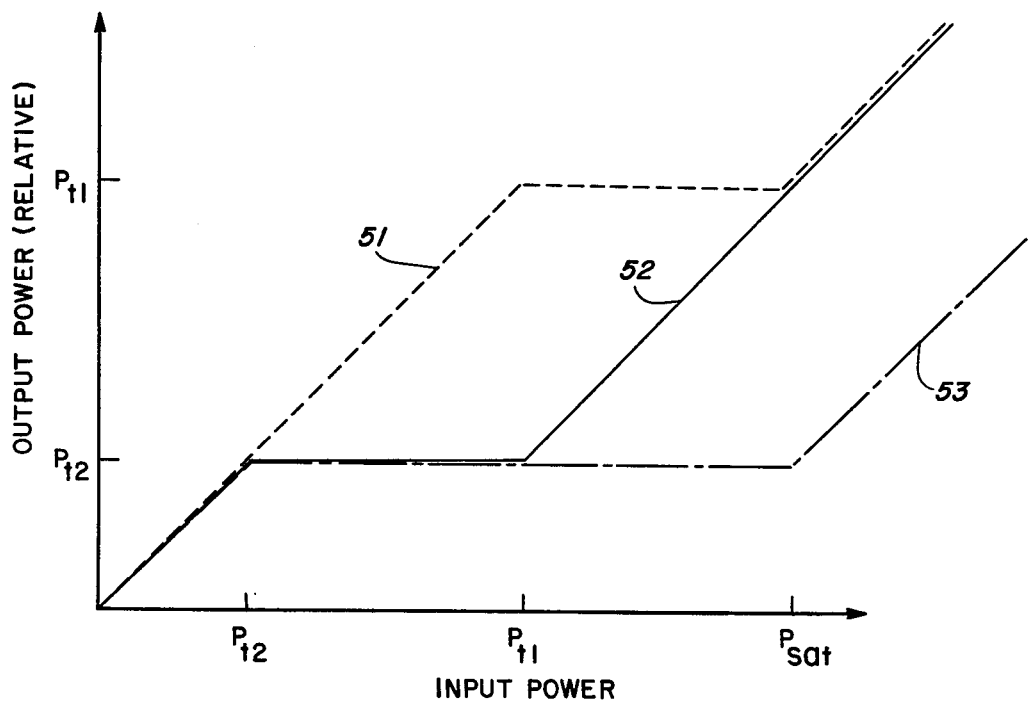
FIG. 5 is a graphical plot showing typical power characteristics of a single stage limiter and a tandem two-stage limiter.

Very often a larger dynamic limiting range is required than is possible using a single resonator. Typically, the power range over which the output power is substantially constant is around 10 dB. It is possible to extend this range by arranging two or more stages in tandem, each successive stage having a lower threshold power than the previous one. This is illustrated in FIG. 5, a graph which shows how the power limiting characteristics of two stages are combined. Typical characteristics of the first stage alone are represented by curve 51, the second stage alone by curve 52, and the characteristics of the two stages combined by curve 53. The threshold of the first stage coincides approximately with the second knee of the second, lower threshold, stage.

Figure 6:
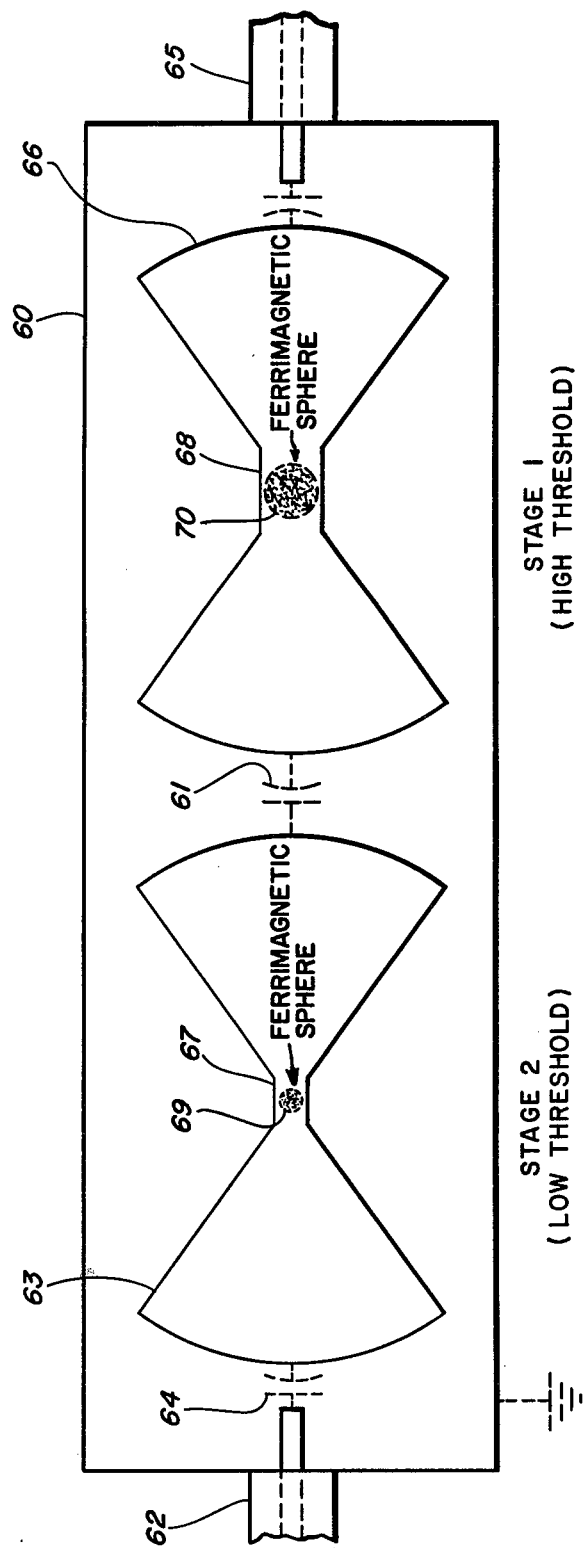
FIG. 6 schematically illustrates in plan view a two-stage power limiter.

FIG. 6 schematically illustrates a suitable and typical tandem arrangement of two double sectoral radial resonators in a single ground potential shield case 60. The two radial resonators are capacitively coupled by the naturally occurring fringing capacitance 61, which is present when the resonators are in close proximity. Obviously, other well known coupling techniques such as probes, and capacitively coupled metal strips may be used to couple the two resonators. Separate individual resonators as illustrated in FIGS. 4a and 4b may also be conventional coupled together by a conventional transmission line to provide two resonators operating in tandem. The output transmission line 62 is capacitively coupled to radial resonator 63 by the capacitance 64 between the probe and the left-hand sector of the radial resonator. Likewise, the input signal on the input transmission line 65 is capacitively coupled to resonant radial sector 66. Preferably, opposing ferrimagnetic spheres are positioned on both sides of the strips 67 and 68 of transmission line connecting the radial sectors for both the high threshold stage and the low threshold stage. (Opposing spheres are positioned relative to the strip lines as illustrated in FIG. 4b.) In the schematic view of FIG. 6 only the spheres 69 and 70 below the resonators are illustrated.

Those practicing this invention will well recognize the relationships between physical dimensions of the resonators, transmission lines, probes and associated structures with the desired frequencies of operation of the limiter. Also the relationships of ferrimagnetic sphere parameters to thresholds, power levels, and frequencies in the microwave art is well known and completely applicable to the invention.

We claim:

1. A frequency selective ferrimagnetic power limiter comprising:
   a. a sectorial, radial, radio frequency transmission line resonator having an inner radius and an outer radius cooperating with a ground plane, with the included angle of the said resonant sector being from approximately 90 degrees to approximately 100 degrees;
   b. a shorting post supporting the said resonant sector and grounding the said resonant sector substantially at its inner radius to the said ground plane;
   c. a sphere of ferrimagnetic material positioned between the said radial resonator and the said ground plane adjacent the said inner radius;
   d. means for coupling a signal into the said radial resonator;
   e. means for coupling a signal out of the said radial resonator; and
   f. means for providing a magnetic bias field substantially perpendicular the said radial resonator.

* * * * *